United States Patent [19]

Martin et al.

[11] Patent Number: 5,167,032

[45] Date of Patent: Nov. 24, 1992

[54] COMPUTER CONTROLLED OPTIMIZED PAIRING OF DISK UNITS

[75] Inventors: Dennis R. Martin, Rochester; Michael J. McDermott, Oronoco; Stuart D. Plumlee, Rochester; Robert H. Satin, Rochester; Robert L. Wenger, Rochester, all of Minn.

[73] Assignee: International Business Machines Corp., Armonk, N.Y.

[21] Appl. No.: 790,802

[22] Filed: Nov. 12, 1991

Related U.S. Application Data

[62] Division of Ser. No. 469,611, Jan. 20, 1990.

[51] Int. Cl.[5] .......................................... G06F 11/20
[52] U.S. Cl. ................................. 395/575; 371/10.1; 371/11.1; 364/268.5; 364/269.2; 364/DIG. 1
[58] Field of Search ................... 371/10.1, 10.2, 11.1; 364/245.31, 236.1, 268.5, 269.2; 395/575

[56] References Cited

U.S. PATENT DOCUMENTS

| | | | |
|---|---|---|---|
| 3,623,006 | 11/1971 | Balakin et al. | 364/200 |
| 3,634,830 | 1/1972 | Baskin | 364/200 |
| 4,608,688 | 8/1986 | Hansen et al. | 371/11.4 |
| 4,819,159 | 4/1989 | Shipley | 364/200 |
| 4,958,273 | 9/1990 | Anderson et al. | 364/200 |

OTHER PUBLICATIONS

Patterson et al., Introduction to Redundant Arrays of Inexpensive Disks (RAID), Dept. of Elect. Engr. and Computer Sciences, U. of Cal., Berkeley, Dec. 1988, pp. 1–12.
Schulze et al., How Reliable is a RAID?, Dept. of Elect. Engr. and Computer Sciences, U. of Cal., Berkeley, Dec. 1988, pp. 1–12.
Patterson, A Case for Redundant Arrays of Inexpensive Disks (RAID), Computer Science Div., Univ. of Cal., Berkeley, Report No. UCB/CSD 87/391, Dec. 1987, pp. 1–23.

Primary Examiner—Charles E. Atkinson

[57] ABSTRACT

A method of pairing disk units in a computer system where mirroring is desirable is disclosed. Where possible, disk units are paired with other disk units located on a different bus. This provides the highest level of protection against inaccessible data due to data loss or failure of a component in the computer system. Where this is not possible, the remaining disk units are paired with disk units located on a different I/O processor, a different controller, or a different disk enclosure. Where none of these pairings are possible, the remaining disk units fall below the threshold level of protection and therefore cannot be paired within the segment. Any disk units that could not be paired are placed on a spare list. The paired disk units with the lowest level of protection are broken apart and added to the spare list, where attempts are again made to pair up the disk units on the spare list. After all units are paired, a pair of disk units is compared with other pairs of disk units to see if the level of protection can be increased by swapping mates. This comparison is repeated until the level of protection is optimized. Each time the computer system is started, a check is made to determine if a configuration change resulted in a lower level of protection. If so, the user is asked if he would like the disk units on the computer system to be re-paired to increase the level of protection.

7 Claims, 15 Drawing Sheets

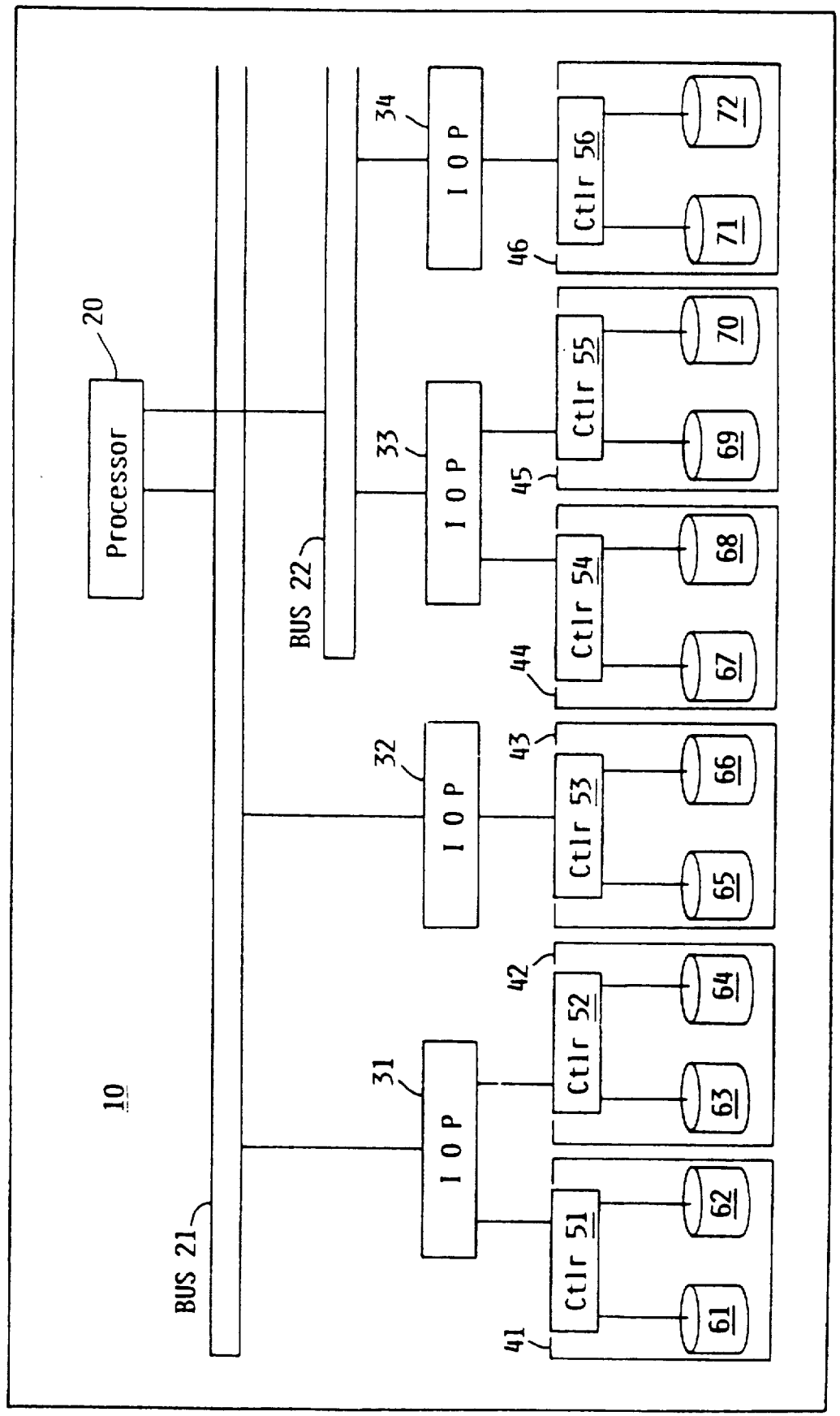
FIG. IA

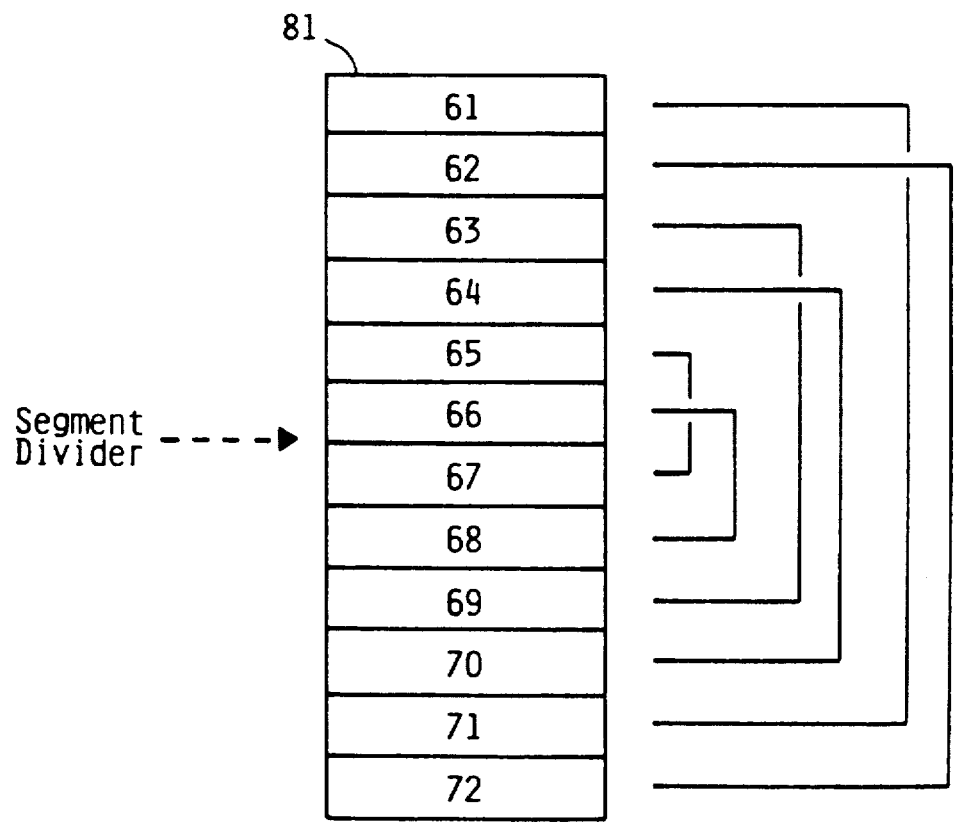
FIG. IB

```
            Proposed Disk Unit Pairings

The following disk unit pairings results in the best
protection against inaccessible data in your
computer system:

Serial                   Level of
Type    Model     Number       Address     Protection
9332    0400      10-0561231   61 - 71     Bus
9332    0400      10-0581721   62 - 72     Bus
9332    0400      10-0561231   63 - 69     Bus
9332    0400      10-5811721   64 - 68     Bus
9332    0400      10-5811714   65 - 67     Bus
9332    0400      10-5811714   66 - 68     Bus Press Enter to accept the pairings and mirror the system.
Press PF-12 to abort
```

FIG. 9A

```
            Proposed Disk Unit Pairings

The following disk unit pairings results in the best
protection against inaccessible data in your
computer system:

Serial                   Level of
Type    Model     Number       Address     Protection
9332    0400      10-0561235   61 - 69     Bus
9332    0400      10-0581725   62 - 70     Bus
9332    0400      10-0561235   63 - 67     Bus
9332    0400      10-5811726   64 - 68     Bus
9332    0400      10-5811717   65 - 73     Bus
9332    0400      10-5811718   66 - 74     Bus Press Enter to accept the pairings and mirror the system.
Press PF-12 to abort
```

FIG. 9B

Notice of Reduced Level of Protection

A configuration change in your computer system has been detected.

Your computer system has a reduced level of protection against inaccessible data due to the configuration change

| Type | Model | Serial Number | Address | Old Level of Protection | New Level of Protection |
|------|-------|---------------|---------|-------------------------|-------------------------|
| 9332 | 0400 | 10-0561233 | 61 - 69 | Bus | Bus |
| 9332 | 0400 | 10-0581723 | 62 - 70 | Bus | Bus |
| 9332 | 0400 | 10-0561233 | 63 - 67 | Bus | Bus |
| 9332 | 0400 | 10-5811722 | 64 - 65 | IOP | IOP |
| 9332 | 0400 | 10-5811711 | 73 - 74 | — | Controller |

Press Enter to accept the reduced level of protection.
Press PF-12 to abort
Press PF-6 to break apart existing pairs and re-pair the system.

FIG. 9C

COMPUTER CONTROLLED OPTIMIZED PAIRING OF DISK UNITS

This is a divisional of co-pending application Ser. No. 07/469,611 filed on Jan. 20, 1990.

FIELD OF THE INVENTION

This invention relates to the data processing field. More particularly, this invention allows disk units in a computer system to be paired in an optimized manner.

BACKGROUND OF THE INVENTION

A computer system that uses Disk Unit Mirroring keeps identical copies of data on a pair of disk units designated as mirrors of one another. If one disk unit in a mirrored pair fails, the system can use the copy of the data on the other unit of that mirrored pair, until the broken unit is repaired and its copy of the data is rebuilt. If the I/O controller for a disk unit fails and the mirror of that unit is attached to a different controller, the system can still continue to run using the disk units attached to the other controller. Likewise, if all of the disk units that are connected to an I/O Processor or Bus are mirrored by disk units connected to different I/O Processors or Busses, the system can survive an I/O Processor or Bus failure and continue to run.

The ability of a mirrored computer system to protect against situations where data could no be accessed, such as when data is destroyed due to a head crash or when data is temporarily unavailable due to a component failure, (hereinafter collectively referred to as "inaccessible data") is directly related to the way the hardware is connected and the way the disk units are arranged in mirrored pairs. Identical hardware can provide either excellent or poor protection.

When a customer or service representative configures a system for mirroring, that person is responsible for arranging the disk units into mirrored pairs. This pairing of the disk units requires an expert understanding of the physical connections of the hardware, so that the hardware path from the disk units of a pair to the system can be duplicated (or mirrored) as much as possible, to increase the level of protection by reducing the number of single hardware failure points. The person pairing up the disk units must also known and follow other system and mirroring restrictions, such as ensuring that the disk units of a mirrored pair are independently serviceable, that like disk device types are paired, etc.

Manual pairing of disk units for mirroring is difficult, time-consuming, and error-prone, and it can frequently result in invalid configurations or configurations with less than optimal pairing and protection.

This problem of manual pairing of disk units for mirroring is magnified whenever the configuration of a computer system changes, such as when a disk unit is added or deleted, when the computer system is recabled, or when a broken unit is replaced with a spare. The level of protection of the computer system against inaccessible data can decrease unbeknownst to the user whenever a configuration change is made. This is clearly undesirable, since the user can have a false sense of security as to the level of protection of his computer system. In order for the user to be adequately protected, he would have to call in his expert to determine if the disk units in his computer system need to be re-paired.

SUMMARY OF THE INVENTION

It is a principle object of the invention to provide an automated method of pairing disk units.

It is another object of the invention to provide an automated method of pairing disk units in a mirrored system which optimizes the level of protection for the computer system against inaccessible data.

It is another object of the invention to detect a configuration change in a computer system having previously paired disk units and re-pair the disk units if the configuration change results in a lower level of protection.

These and other objects are accomplished by the computer controlled optimized pairing of disk units invention disclosed herein.

A computer system contains one or more disk units connected to a controller in a disk enclosure. One or more disk enclosures are connected to an I/O processor. One or more I/O processors are connected to a bus. The computer system may contain one or more busses.

Pairing disk units in a computer system starts by sorting by address all disk units having the same device type. A segment is defined for each group of disk units with the same device type that has the same number of disk units per disk enclosure. The first segment processed contains the highest number of disk units per disk enclosure. Where possible, disk units are paired with other disk units located on a different bus. This provides the highest level of protection against inaccessible data due to data loss or failure of a component in the computer system. Where this is not possible, the remaining disk units are paired with disk units located on a different I/O processor. This provides the next highest level of protection. Where this is not possible, the remaining disk units are paired with disk units located on a different controller. This provides the next highest level of protection. Where this is not possible, the remaining disk units are paired with disk units located on a different disk enclosure. This provides the next highest level of protection. Where this is not possible, the remaining disk units fall below the threshold level of protection and therefore cannot be paired within the segment. The threshold level of protection can be adjusted upwards or downwards depending on the nature of the computer system. The remaining segments are processed in a similar manner.

If any disk units could not be paired within their segment, they are placed on a spare list. Several attempts are made to pair up disk units on the spare list. If all of these attempts fail, the paired disk units with the lowest level of protection are broken apart and added to the spare list, where attempts are again made to pair up the disk units on the spare list. This process of breaking apart paired disk units with the lowest level of protection and adding them to the spare list continues until all disk units in a computer system are paired.

After all units are paired, a pair of disk units is compared with other pairs of disk units to see if the level of protection can be increased by swapping mates. This comparison of pairs of disk units is repeated until the level of protection is optimized.

Each time the computer system is started, a check is made to determine if a configuration change resulted in a lower level of protection. If so, the user is asked if he would like the disk units on the computer system to be re-paired to increase the level of protection.

BRIEF DESCRIPTION OF THE DRAWING

FIG. 1A shows a hardware diagram of a simple computer system where disk pairing is desirable.

FIG. 1B shows the segment list and selected pairings for the computer system of FIG. 1A.

FIG. 9A-9C shows the display screens of the invention.

DESCRIPTION OF THE PREFERRED EMBODIMENT

Figure 2A:
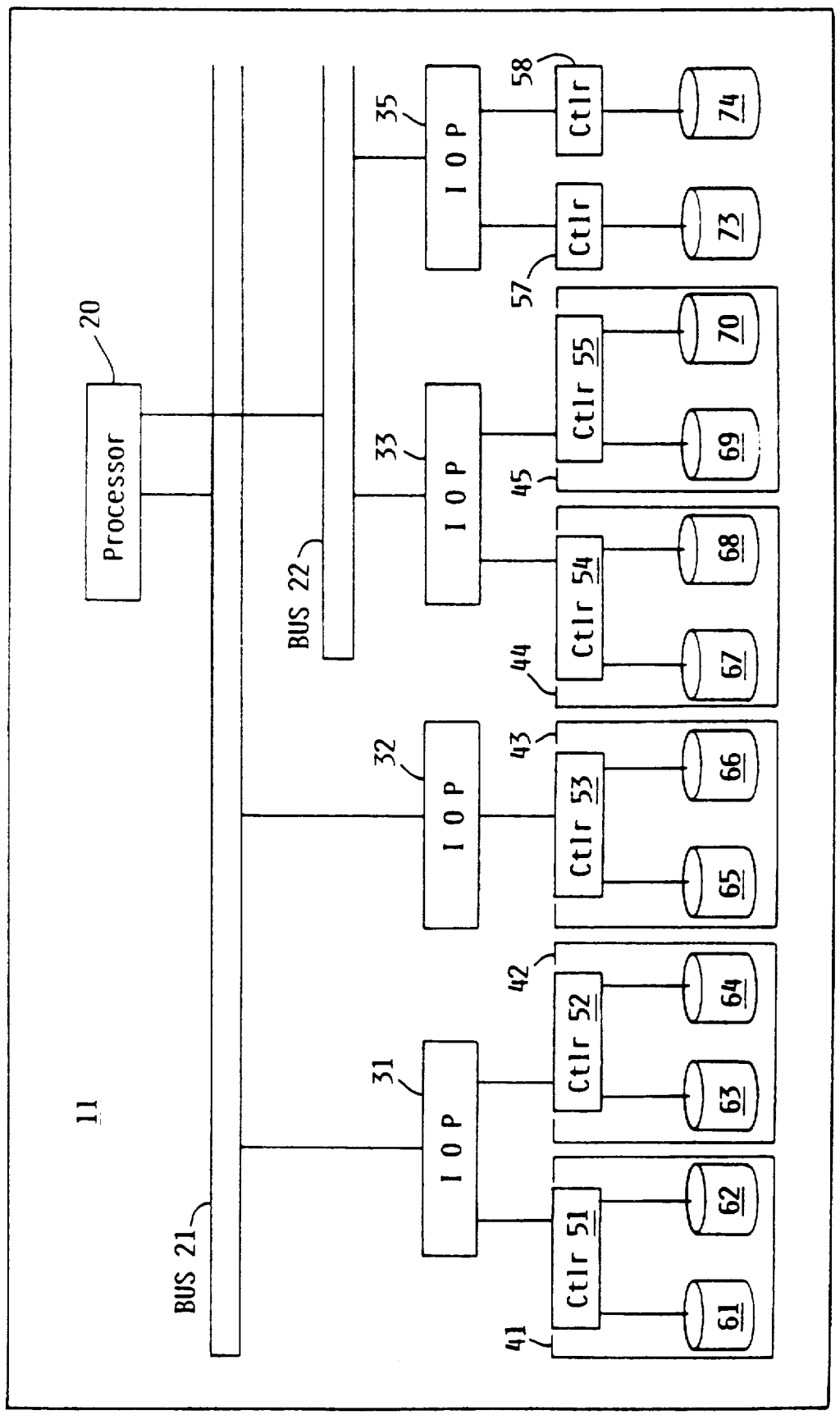
FIG. 2A shows a hardware diagram of a more complex computer system where disk pairing is desirable.

FIG. 1A shows a hardware diagram of computer system 10 of the invention. Processor 20 is connected to bus 21 and bus 22. Bus 21 is connected to I/O processors 31 and 32. Bus 22 is connected to I/O processors 33 and 34. I/O processor 31 is connected to disk enclosures 41 and 42. Disk enclosure 41 contains controller 51 and disk units 61 and 62. Disk enclosure 42 contains controller 52 and disk units 63 and 64. I/O processor 32 is connected to disk enclosure 43. Disk enclosure 43 contains controller 53 and disk units 65 and 66. I/O processor 33 is connected to disk enclosures 44 and 45. Disk enclosure 44 contains controller 54 and disk units 67 and 68. Disk enclosure 45 contains controller 55 and disk units 69 and 70. I/O processor 34 is connected to disk enclosure 46. Disk enclosure 46 contains controller 56 and disk units 71 and 72. In the preferred embodiment, computer system 10 is an IBM Application System/400 midrange computer, although any computer system where pairing of disk units is desirable could be used.

FIG. 2A shows a hardware diagram of computer system 11 of the invention. Note that computer system 11 is nearly identical to computer system 10 of FIG. 1A, but that I/O processor 34 is not connected to disk enclosure 46. Instead, I/O processor 35 is connected directly to controller 57 and controller 58. Controller 57 is connected to disk unit 73, and controller 58 is connected to disk unit 74.

Figure 2B:
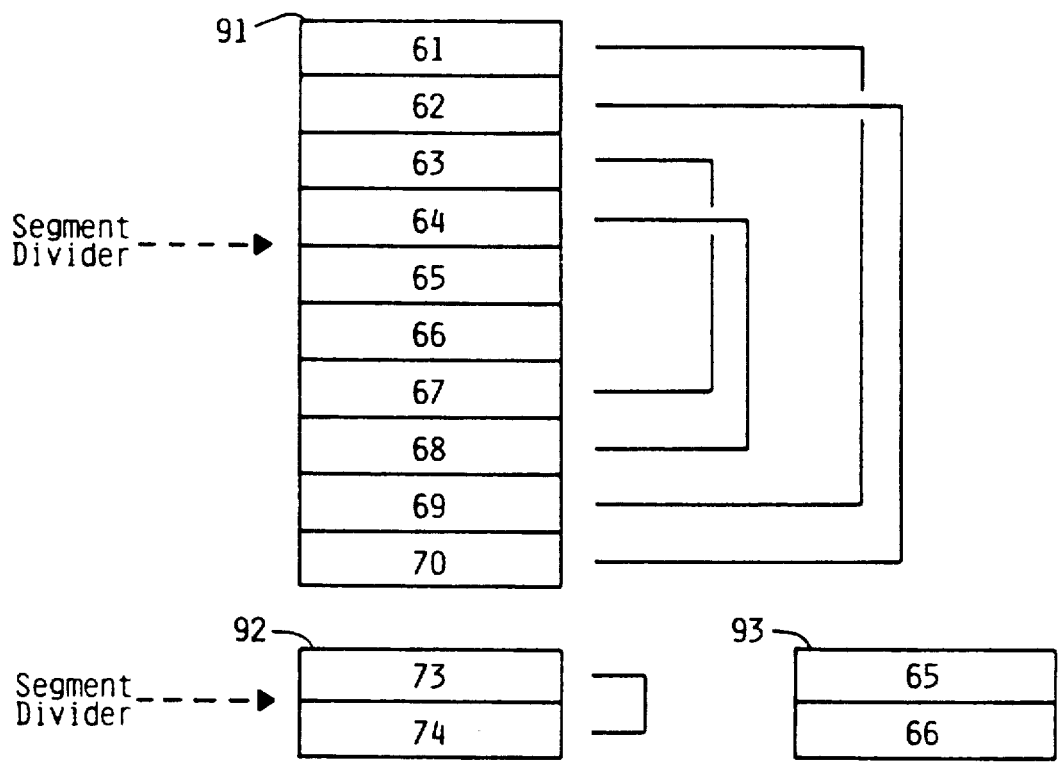
FIG. 2B shows the segment lists, spare list, and preliminary selected pairings for the computer system of FIG. 2A.
Figure 2C:
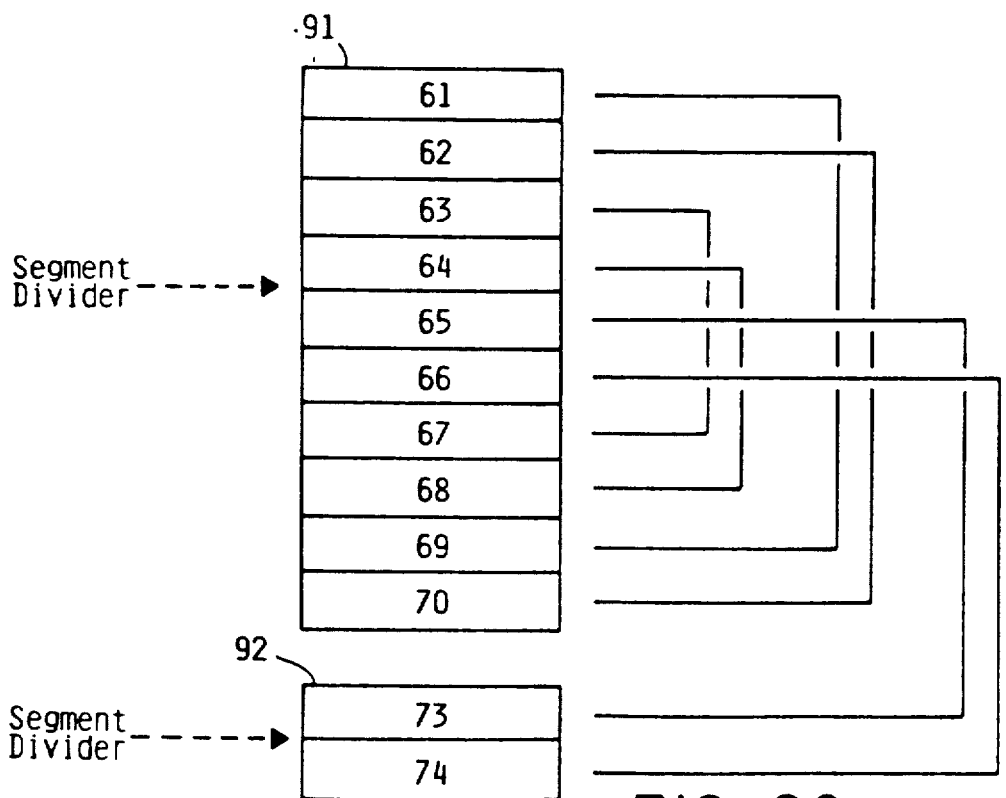
FIG. 2C shows the segment lists and final selected pairings for the computer system of FIG. 2A.
Figure 2D:
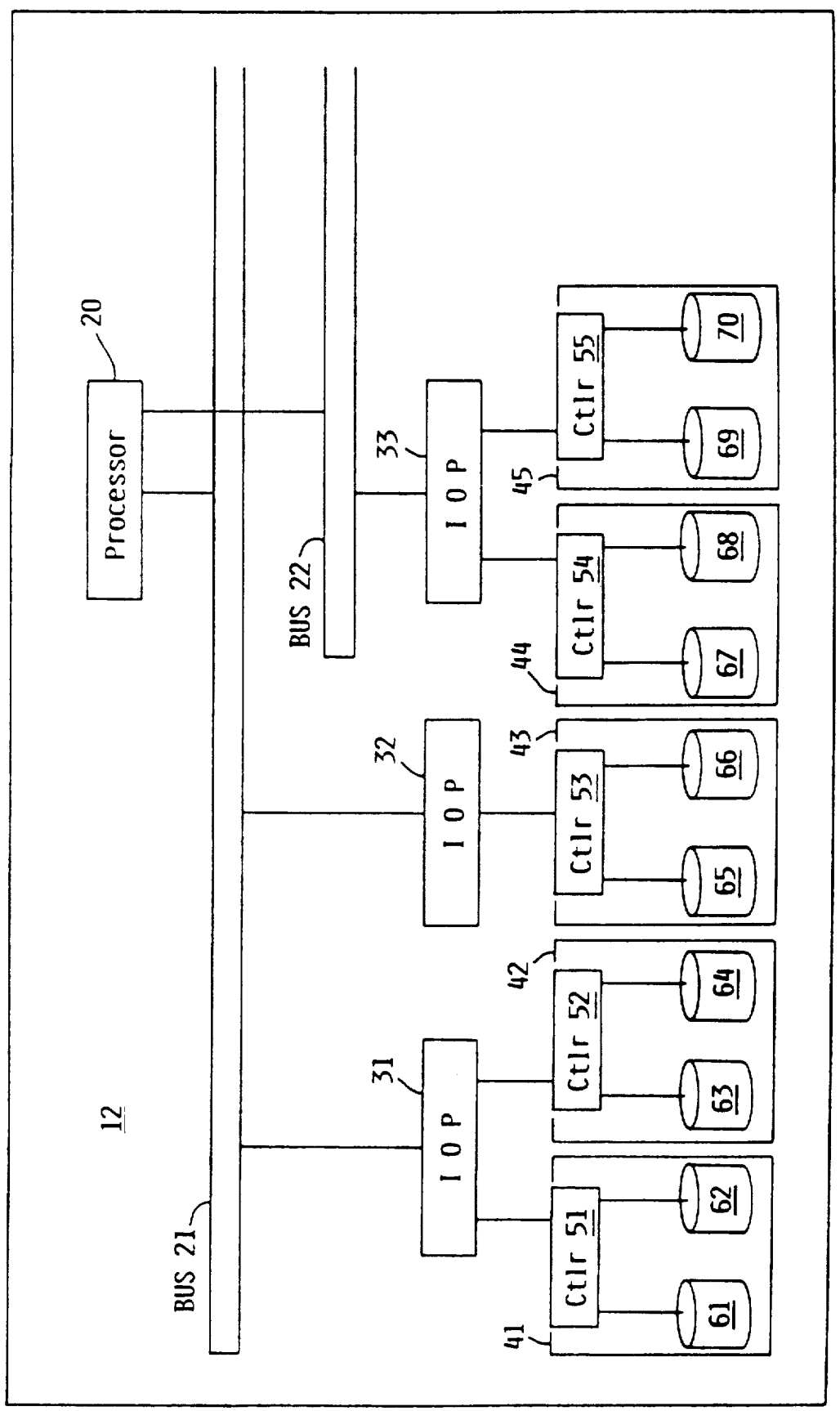
FIG. 2D shows a hardware diagram of another computer system before a configuration change is performed.

The flowcharts of the invention shown in FIGS. 3-8 show how a suitably programmed processor 20 of FIGS. 1A, and 2A, and 2D operates to increase the level of protection against inaccessible data. FIGS. 3-8 will first be explained to show how the disk units of computer system 10 of FIG. 1A are paired. After this is done, FIGS. 3-8 will be revisited to explain how the disk units of the more complicated computer system 11 are paired. Finally, FIGS. 3-8 will show how a changed configuration of computer system 12 of FIG. 2D results in a reduced level of protection and how the user is notified of this fact and can request that the disk units be re-paired.

Pairing of the Disk Units of Computer System 10

Figure 3:
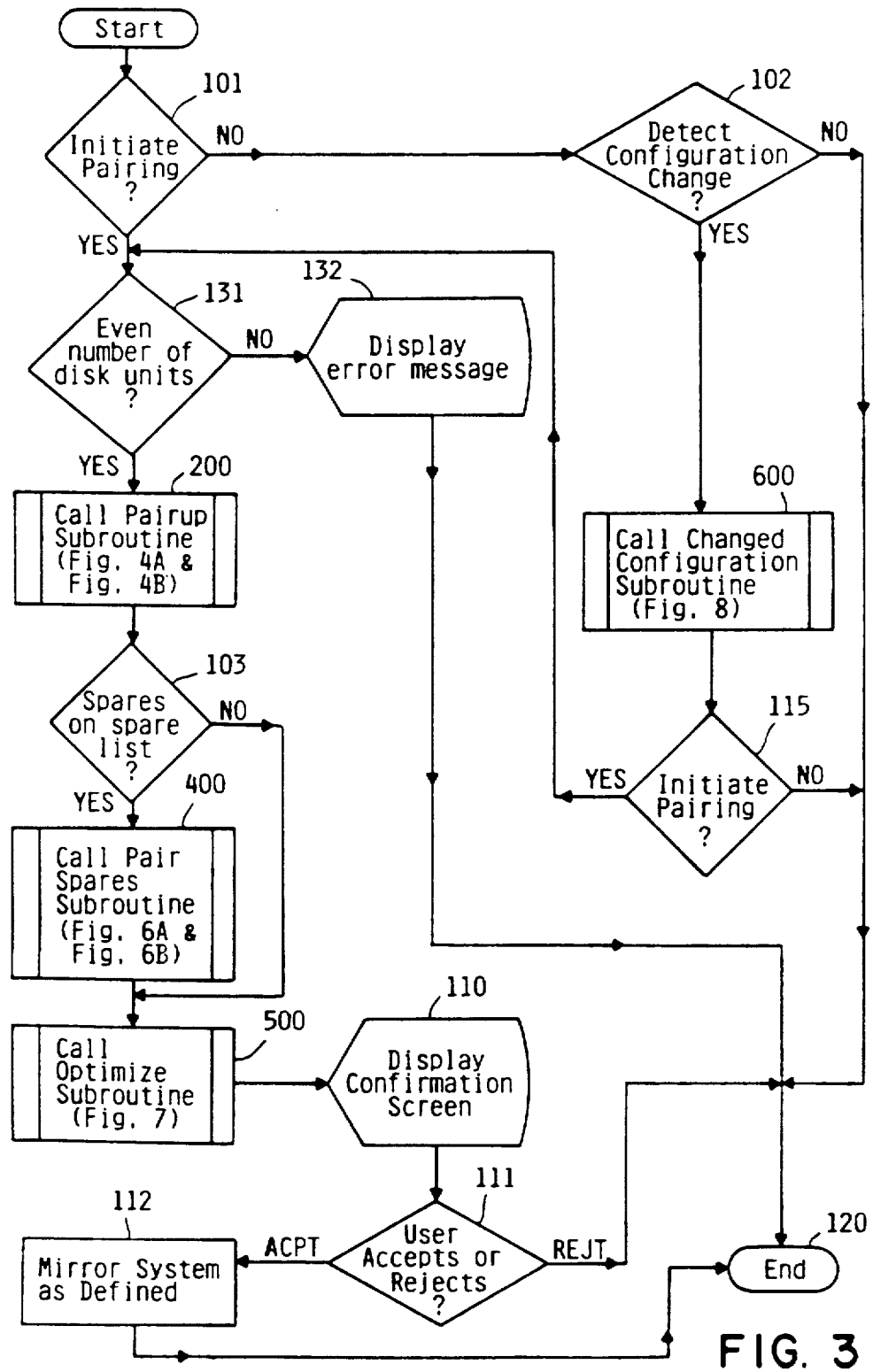
FIGS. 3, 4A, 4B, 5, 6A, 6B, 7 and 8 show flowcharts of the invention.
Figure 4A:
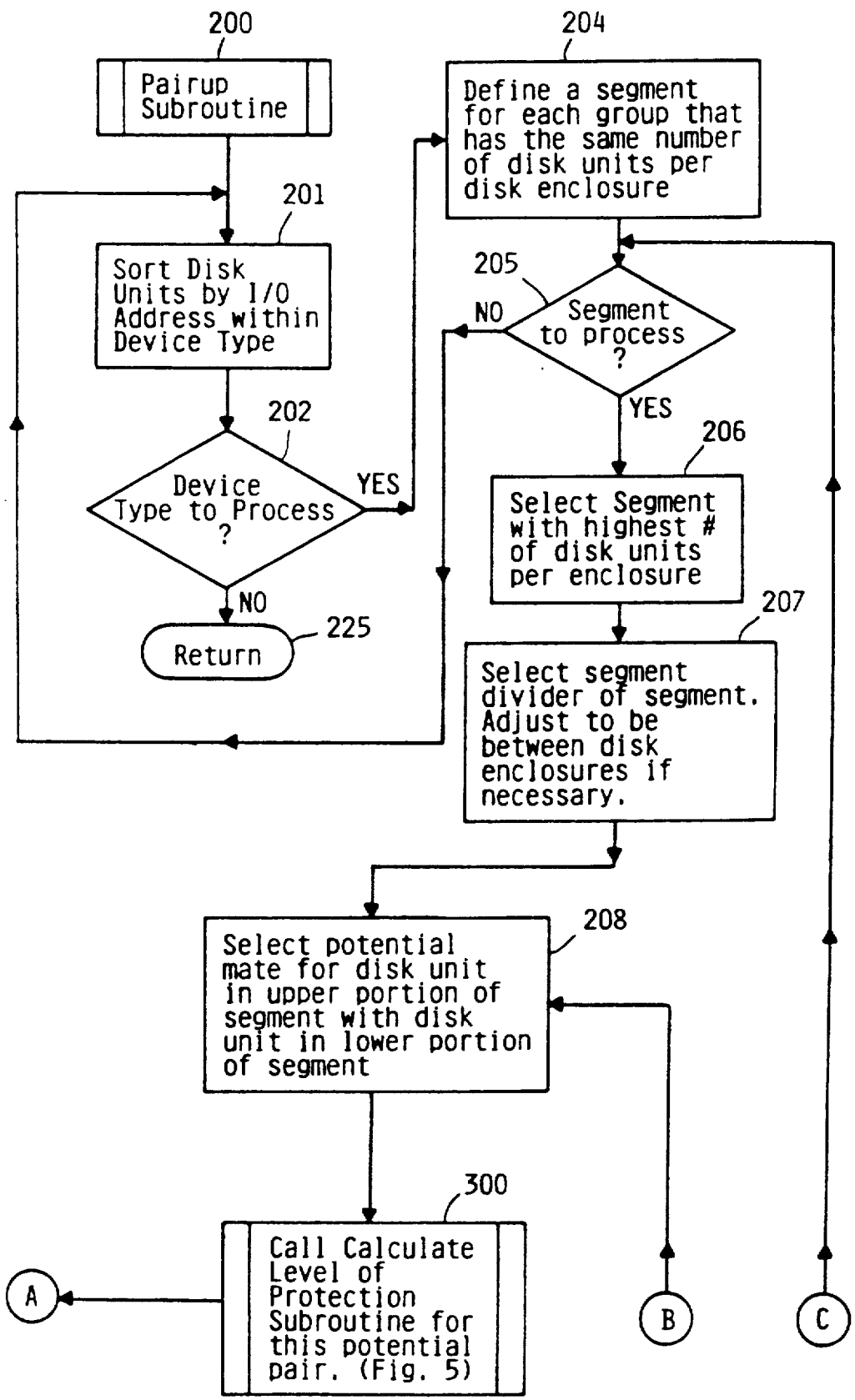
Figure 4B:
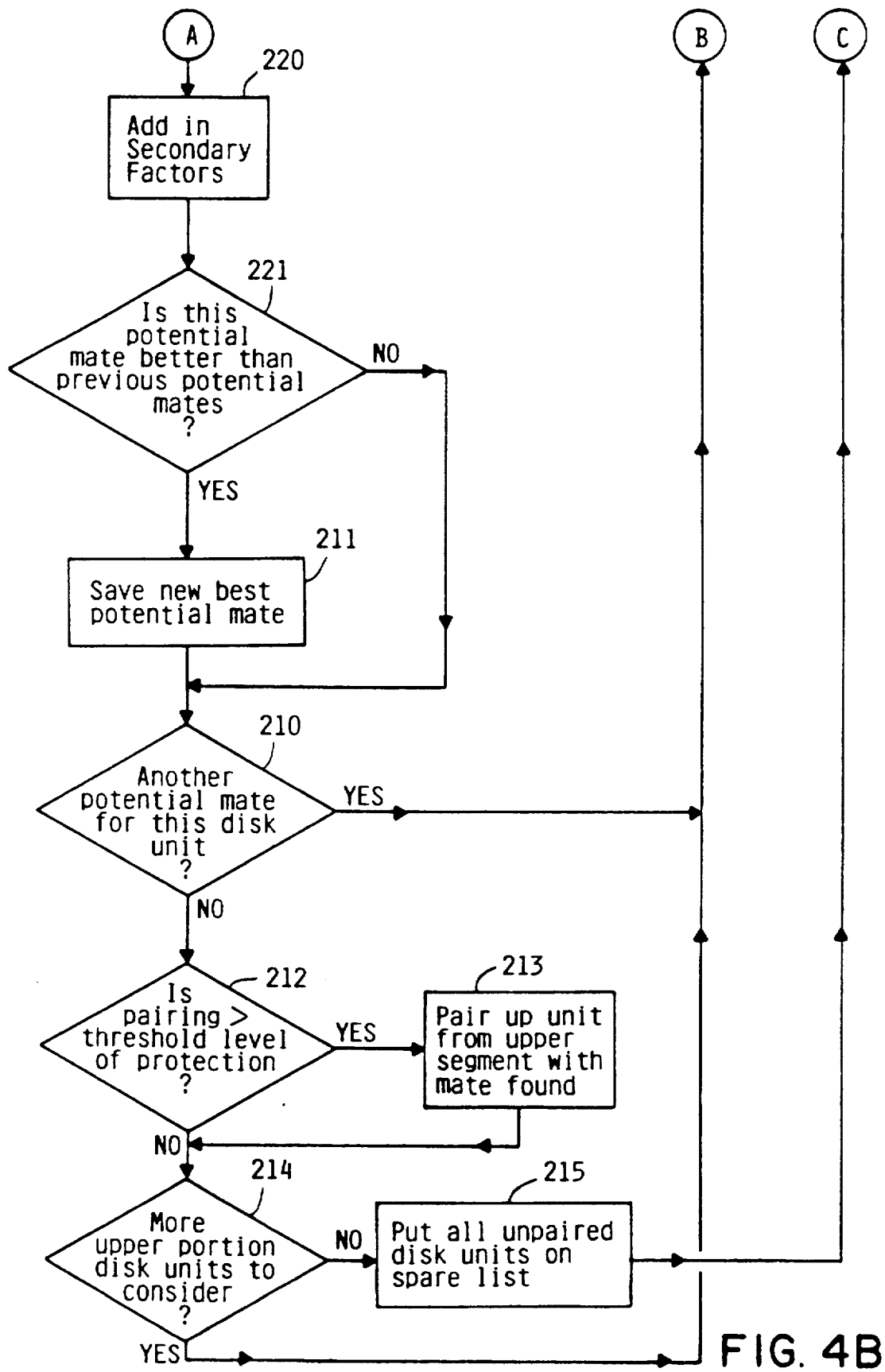

Referring now to FIG. 3, block 101 asks if the user wants to initiate pairing. If so, block 131 checks to see if there is an even number of disk units per device type. If not, pairing cannot be done, an error message is displayed in block 132, and the program ends in block 120. If block 131 is answered affirmatively, the Pairup Subroutine of FIG. 4 is called in block 200. Referring now to FIG. 4, block 201 sorts all disks units by I/O address within a device type. All disk units of computer system 10 of FIG. 1A are the same device type. Disk units 61-72 of FIG. 1A each have an I/O address associated with them. For purposes of this example, assume disk units 61-72 have corresponding device addresses of 61-72 and are sorted accordingly. Block 202 asks if there is a device type to process. Since we have one device type to process, block 202 is answered affirmatively.

Block 204 defines a segment for each group of disk units that have the same number of disk units per disk enclosure. Computer system 10 has six disk enclosures 41-46 that each have the same number of disk units—two. Therefore, block 204 defines the segment for this group. Block 205 asks if there is a segment to process. Since we have one segment to process, block 26 selects the only segment as the segment with the highest number of disk units per disk enclosure. Block 207 selects the segment divider of the segment as being between disk units 66 and 67. (FIG. 1B) Block 207 would also adjust the segment divider of the segment to be between disk enclosures if necessary. This is done to encourage disk enclosure to disk enclosure pairing. Such pairing is desirable since if one disk enclosure fails, only one other disk enclosure needs to remain working until the disk enclosure that failed is fixed or replaced. This adjustment is not necessary with computer system 10 since the segment divider of the segment is already between disk enclosure 43 and disk enclosure 44.

In the preferred embodiment, block 208 starts with the disk unit closest to the segment divider in the upper portion of the segment (disk unit 66) and selects a potential mate for this disk unit with the disk unit in the lower portion of the segment, starting with the disk unit closest to the segment divider. In our example, block 208 first selects disk unit 67 as a potential mate for disk unit 66. Block 300 then calls Calculate Level of Protection Subroutine in FIG. 5.

Alternate embodiments have been contemplated which would select potential mates differently than the selection method of the preferred embodiment, still falling within the spirit and scope of this invention. For example, an alternate selection method would start at the beginning of the relevant portion of the segment to select the first disk unit and its first prospective mate and work down the list to select subsequent prospective mates.

Figure 5:
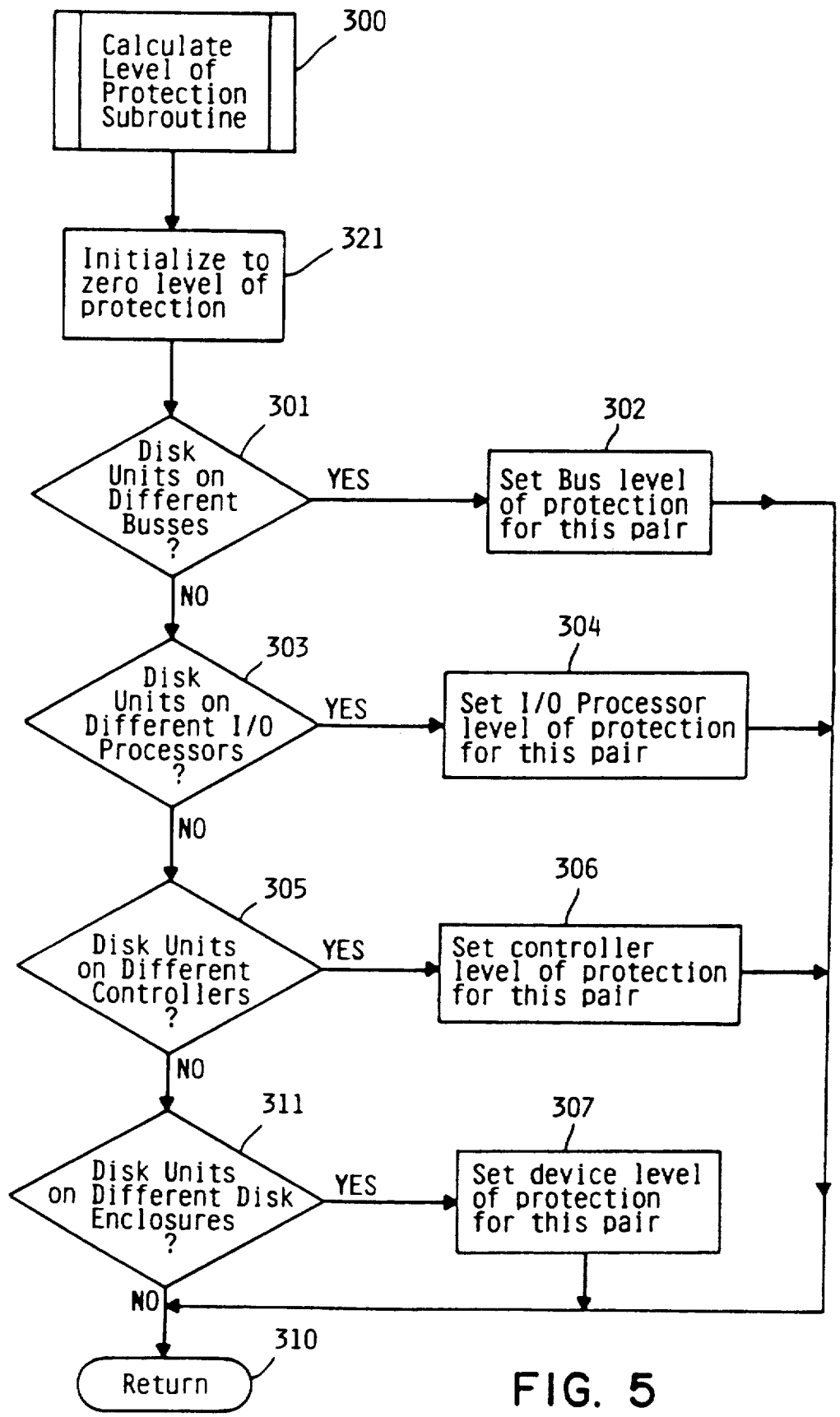

Referring now to FIG. 5, the Calculate Level of Protection Subroutine determines a level of protection for potential disk unit pair 66 and 67. Block 321 initializes the level of protection to zero. "Level of protection" is defined herein as the ability to minimize against having inaccessible data due to single component failure points. Level of protection is highest when there are the fewest component failure points that would cause inaccessible data. Conversely, the level of protection is lowest when there are the most component failure points that would cause inaccessible data. In the architecture of the computer system of the preferred embodiment, but level protection is best and is given a arbitrary value of 32 points. I/O processor level protection is next best and is given a value of 16 points. Controller level protection is next best and is given a value of 8 points. Device level protection is next best and is given a value of 4 points. The threshold level of protection is given a value of 3. These values are arbitrary design choices and can change based on the architecture of the computer system and other factors.

Block 301 asks if these disk units are on different busses. Since disk unit 66 is on bus 21 and disk unit 67 is on bus 22 (FIG. 1A), block 301 is answered affirmatively and block 302 sets the level of protection for this pair equal to a bus level of protection (32 points). This is the highest level of protection against inaccessible data is computer system 10, since computer system 10 will not have inaccessible data due to a single component failure. The subroutine returns in block 310 to block 220 of FIG. 4.

Block 220 adds points for secondary factors, if any, to the level of protection value determined in the Calculate Level of Protection Subroutine. These secondary factors are used to break ties among potential mates having the same level of protection. One example of a secondary factor is the desire to pair disk units that occupy the same position in their respective disk enclosures. In other words, it is preferrable, for esthetic and usability reasons, to pair of disk unit occupying the left position in its disk enclosure with another disk unit occupying a left position in its disk enclosure. Other secondary factors, such as the preference in pairing a full disk unit with an empty disk unit (to improve performance in starting mirroring) can also be considered in box 220. Secondary factors are also given numeric values, but these values should be lower than the lowest level of protection value assigned by the Calculate Level of Protection Subroutine.

In our example, assume there is on secondary factor: left to left and right to right pairing within a disk enclosure. This secondary factor is assigned an arbitrary value of 2.

Block 220 determines that disk unit 66 occupies the "right" position in its enclosure, while disk unit 67 occupies the "left" position. Therefore, the secondary factor condition was not met and no additional points are added to the 32 points this potential pair obtained for having bus level of protection.

Block 221 determines if this potential mate has a higher level of protection than previous potential mates. If so, block 211 saves the new best potential mate. In our example, block 211 would save disk unit 67 as the best mate, since it is the only potential mate processed thus far. Block 210 asks if there is another potential mate for disk unit 66 in the lowest portion of the segment. Since disk units 68-72 are all potential mates for disk unit 66, flow of control loops between blocks 208, 300, 220, 221, 2211 and 210 for all potential mates. In our example, the Calculate Level of Protection Subroutine determines that all potential mates have bus level of protection (32 points), but block 220 gives disk units 68, 70 and 72 two extra points for being located in the "right" position of their disk enclosures. Since disk unit 68 was the first disk unit to be awarded the extra points, it is considered to be the best potential mate.

Block 212 checks to see if the level of protection of disk units 66 and 68 exceeds the threshold level of protection. In the preferred embodiment, bus level protection is best, followed by I/O processor level protection, controller level protection, and device level protection. The threshold level of protection in the preferred embodiment is set below device level protection, which means that if two disk units to be paired are in the same disk enclosure, pairing is unacceptable and will not be performed. Note that this threshold level of protection could be adjusted based on the minimum level of protection desired. For example, a more sensitive computer system may want to set the threshold level of protection higher.

Note that the levels of protection from best to worst can be defined differently based on the architecture of a particular computer system. For example, if the architecture of a computer system has disk enclosures connected directly to a single bus, the highest level of protection would be device level protection. In this alternate embodiment, FIG. 5 would be modified to connect block 321 directly to block 311, thus bypassing blocks 301-306.

In our example, block 212 determines that the level of protection for disk units 66 and 68 exceed the threshold level of protection and block 213 pairs up unit 66 with unit 68. If block 212 was answered negatively, the disk units would not be paired up. In either event, flow of control moves to block 214, where a determination is made whether there are more disk units in the upper portion of the segment to process. In our example, disk units 65-61 are left to process, so block 214 is answered affirmatively and flow of control goes back to block 208 to select a potential mate for the next disk unit on the list, disk unit 65. Blocks 208-221 are repeated until pairing has been attempted with all disk units in the upper portion of the segment.

Disk units 65-61 are paired in the same manner as discussed above. All were able to find mates in the lower segment that provided bus level of protection. Disk unit 65 was paired with disk unit 67. Likewise, disk units 61, 62, 63, and 64 were paired with disk units 71, 72, 69, and 70, respectively. FIG. 1B shows how the disk units in the segment were paired.

Referring again to FIG. 4, block 214 determines that there are no more upper portion disk units to consider, so block 215 puts any unpaired disk units on a spare list. Since all disk units were successfully paired, no disk units are placed on the spare list and flow of control moves to block 205 to see if there is another segment to process. Since we only had one segment in our example, block 205 is answered negatively, and block 202 checks to see if there are any disk units with a different device type to process. Each device type is processed separately in the preferred embodiment to assure compatibility of mirroring. Since in our example all disk units had the same device type, block 202 is answered negatively, and the subroutine returns in block 225 to block 103 of FIG. 3.

Figure 6A:
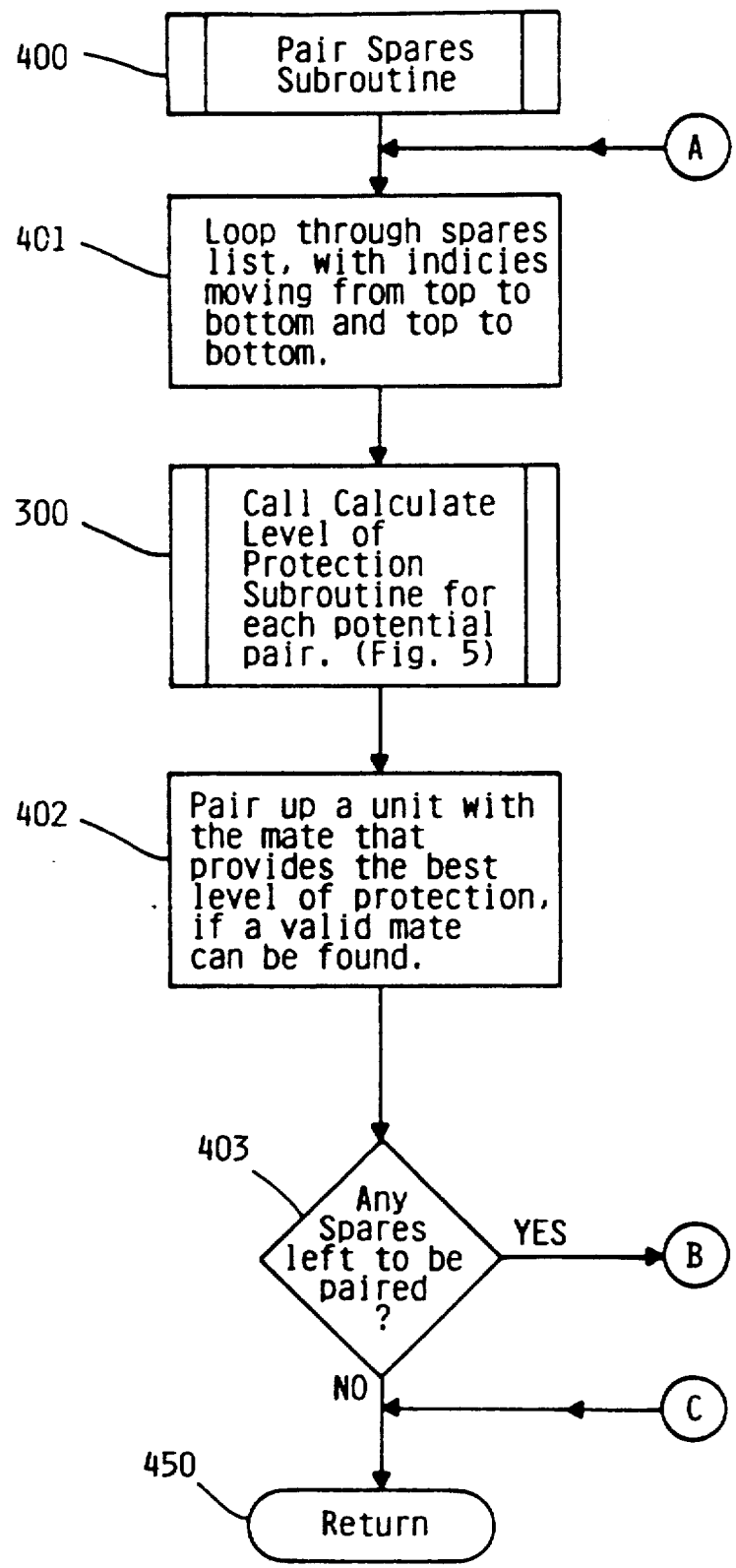
Figure 6B:
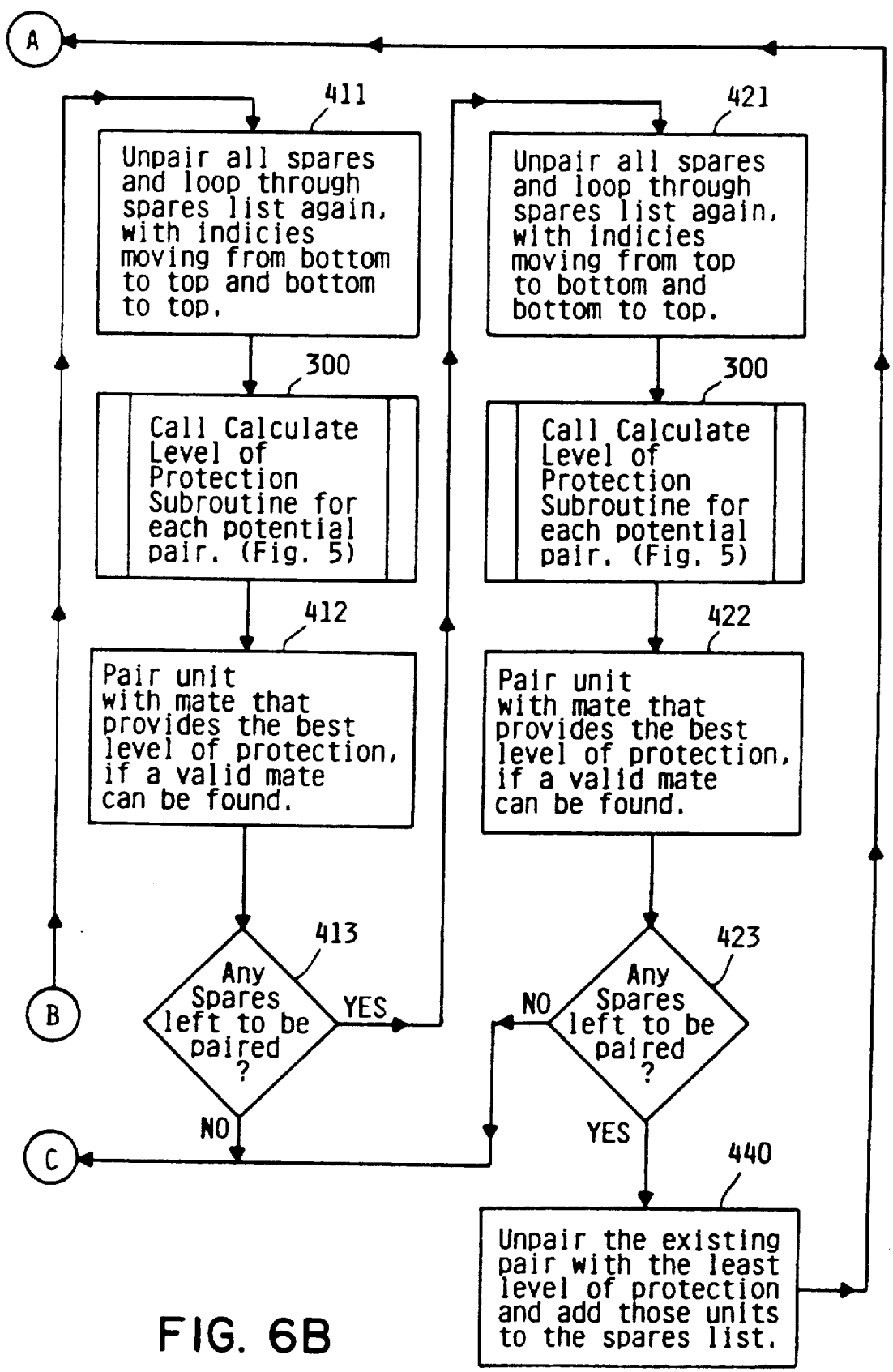

Block 103 of FIG. 3 asks whether there are any disk units on the spare list. Disk units are placed on a spare list if they could not be paired because the potential pairing did not exceed to the specified threshold level of protection, or if the upper portion of the segment contains a different number of disk units than the lower portion of the segment. In our example, all disk units were successfully paired up, so block 103 is answered negatively, thus skipping the Pair Spares Subroutine of block 400 as shown in FIG. 6. The Pair Spares Subroutine of FIG. 6 will be discussed in detail later when the pairing of disk units in computer system 11 of FIG. 2 is discussed.

Figure 7:
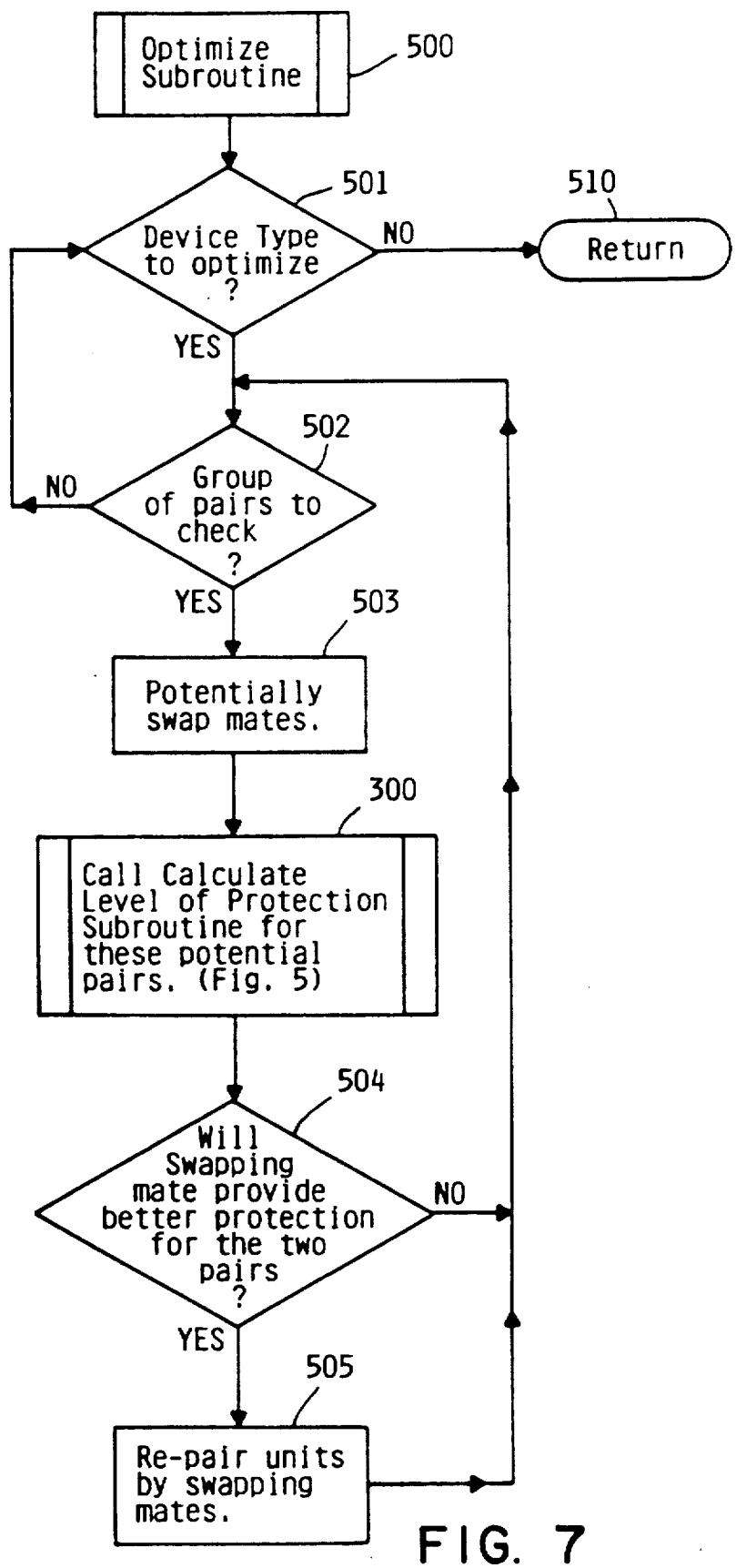

Referring again to FIG. 3, block 500 calls the Optimize Subroutines of FIG. 7. This subroutine determines if the selected pairings could be optimized by swapping mates between disk unit pairs. Referring now to FIG. 7, block 501 determines if there is a device type of disk units to optimize. In our example, all disk units 61-72 have the same device type, as has been discussed, so we do have one device type to optimize. Block 502 checks the first group of pairs of disk units. In our example, pairs 61+71 and 62+72 are checked first. Block 503 potentially swaps mates between these pairs of disk units to see the swap results in a higher level of protection. Therefore, block 503 considers disk units 61 and 72 to be potential mates, as well as disk units 62 and 71.

The Calculate Level of Protection Subroutine of FIG. 5 is called in block 300, operates in a manner as has been discussed, and returns to block 504. This subroutine determines that potential mates 61 and 72 and potential mates 62 and 71 both have bus level of protection. Block 504 determines that since pairs 61+71 and 62+72 also had bus level of protection, swapping mates will not provide a better level of protection. Therefore, block 504 is answered negatively, and flow of control moves back to block 502 to check another group of pairs. Flow of control loops through blocks 502 to 504 until all groups of pairs have been checked. Since all disk unit pairs of computer system 10 in our example have a bus level of protection, block 504 is always answered negatively, so no units are re-paired by swapping mates in block 505. When block 502 determines that there are no more groups of pairs to check, it is answered negatively and loops back to block 501. When block 501 determines that there are no more device types of disk units to optimize, the subroutine returns in block 510 to block 110 in FIG. 3.

Referring again to FIG. 3, a screen is displayed to the user stating the pairing selected for each disk unit of the computer system in block 110. An example of such a screen for computer system 10 of FIG. 1A is shown in FIG. 9A. This screen identifies the level of protection for each pair of disk unit sin computer system 10, and asks the user whether this is acceptable or not. The user may look at the level of protection and decide that it is desirable to re-configure his hardware by adding more components or connecting the components he has differently to improve the level of protection. In this case, the user would reject the pairing, block 111 is answered negatively, and the program ends in block 120. If the user accepts the pairing, block 112 proceeds to mirror the computer system with the accepted pairings in a conventional manner. In our example, this means that the same data is contained on disk unit 61 as is on disk unit 71. Likewise, the same data is on disk units 62 and 72, 63 and 69, 64 and 70, 65 and 67, and 66 and 68. After this is done, computer system 10 is protected against inaccessible data from a single component failure point, be it a bus, I/O processor, controller, disk enclosure or disk unit. FIG. 1B shows how segment 81 was created, and how the disk units contained in segment 81 were paired.

Pairing of the Disk Units of Computer System 11 of FIG. 2

FIG. 2A shows computer system 11 which involves a more complicated pairing process than computer system 10 of FIG. 1A. The flowcharts of FIGS. 3 through 8 will be revisited to explain how the disk units of computer system 11 would be paired. As previously noted, computer system 11 is nearly identical to computer system 10 of FIG. 1A, except I/O processor 34 is not connected to disk enclosure 46. Instead, I/O processor 35 is connected directly to controller 57 and controller 58. Controller 57 is connected to disk unit 73, and controller 58 is connected to disk unit 74. Therefore, disk units 73 and 74, unlike the rest of the disk units, are each considered to be alone in their own disk enclosures (referred to by like numeral as disk enclosures 73 and 74) Therefore, disk enclosures 73 and 74 have a smaller number of disk units than all other disk enclosures in computer system 20.

Referring now to FIG. 3, block 101 asks if the user wants to initiate pairing. If so, Pairup Subroutine of FIG. 4 is called in block 200 after block 131 determines there is an even number of disk units. Referring now to FIG. 4, block 201 sorts all disk units by I/O address within device type. All disk units of computer system 11 of FIG. 2 are the same device type. Block 202 asks if there is a device type to process. Since we have one device type to process, block 202 is answered affirmatively. Disk units 61-70 and 73-74 of FIG. 2A each have an I/O address associated with them. For purposes of this example, assume disk units 61-70 and disk units 73-74 have corresponding device addresses of 61-70 and 73-74 and are sorted accordingly.

Block 204 defines a segment for each group of disk units that have the same number of disk units per disk enclosure. Computer system 11 has five disk enclosures 41-45 that all have two disk units each. Computer system 11 also has two disk enclosures 73-74 that both have one disk unit each. Therefore, block 204 defines two segments for these two groups of disk enclosures. This is done to encourage disk enclosure to disk enclosure pairing. Block 205 asks if there is a segment to process. We presently have two segments to process, and block 206 begins by selecting the segment with the highest number of disk units per disk enclosure. In our example, this is segment 91 as shown in FIG. 2B, containing disk units 61-70. Block 207 initially selects the segment divider of the segment as being at the midpoint of segment 91, between disk units 65 and 66, but upon noticing that this choice would undesirably split disk enclosure 43 in half, block 207 adjusts the segment divider of the segment to be between disk units 64 and 65 (thus between disk enclosures 42 and 43).

Block 208 takes the disk unit in the upper portion of the segment closest to the segment divider (disk unit 64) and selects a potential mate for this disk unit with a disk unit in the lower portion of the segment beginning with the disk unit closest to the segment divider.

In our example, block 208 selects disk unit 65 as a potential mate. Block 300 then calls Calculate Level of Protection Subroutine in FIG. 5.

Referring now to FIG. 5, the Calculate level of Protection Subroutine determines a level of protection for potential disk unit pair 64 and 65. Block 301 asks if these disk units are on different busses. Since these disk units are both on bus 21 (FIG. 2A) block 301 is answered negatively. Block 303 then asks if these disk units are on different I/O processors. Since disk unit 64 is on I/O processor 31 an disk unit 65 is on I/O processor 32, (FIG. 2), block 303 is answered affirmatively and block 304 sets the level of protection for this pair equal to an I/O controller level of protection. The subroutine returns in block 310 to block 220 of FIG. 4.

Block 220 does not add any secondary factor points, since disk unit 64 occupies the "right" position in its disk enclosure and disk unit 65 occupies the "left" position.

Block 221 determines this potential mate is the best so far, so block 221 saves it. Block 210 asks if there is another potential mate for disk unit 64 in the lower portion of the segment. Since disk units 66-70 are also potential mates for disk unit 64, flow of control loops between blocks 208, 300, 220, 221, 211 and 210 for all potential mates. In our example, the Calculate Level of Protection Subroutine determines that potential mate 66 has I/O Processor level of protection, while potential mates 67-70 all have bus level protection.

Block 220 gives extra points to disk units 66, 68 and 70. Disk unit 68 is selected as the best potential mate for disk unit 64.

Block 212 checks to see if the level of protection of disk units 64 and 68 exceeds the threshold level of protection. In our example, block 212 determines that the level of protection for disk units 64 and 68 exceed the threshold level of protection and block 213 pairs up disk unit 64 with disk unit 66. If block 212 was answered negatively, the disk units would not be paired up. In either event, flow of control moves to block 214, where a determination is made whether there are more disk units in the upper portion of the segment to process. In our example, disk units 63-61 are left to process, so block 214 is answered affirmatively and flow of control goes back to block 208 to select a potential mate for the next disk unit on the list, disk unit 63. Blocks 208-221 are repeated until pairing has been attempted with all disk units in the upper portion of the segment.

Disk units 63-61 are paired in the same manner as discussed above. All were able to find mates in the lower segment that provided bus level of protection. Disk unit 63 was paired with disk unit 67. Likewise, disk units 62 and 61 were paired with disk units 70, and 69, respectively.

Referring again to FIG. 4, block 214 determines that there are no more upper portion disk units to consider, so block 215 puts any unpaired disk units on a spare list. Note that disk units 65 and 66 have not been paired yet, so that disk units are placed on the spare list.

Flow of control moves to block 205 to see if there is another segment to process. Since we have two segments in our example to process, FIG. 4 will now process the second segment, shown as segment 92 in FIG. 2B. FIG. 4 pairs up disk units 73 and 74, since they are the only disk units in the segment, and assigns this potential pair a controller level of protection. The controller level of protection does exceed the threshold level of protection, so the units are paired in block 213. Block 205 determines that there are no more segments to process, and block 202 determines that there are no more device types to process, so the subroutine returns in block 225 to block 103 of FIG. 3. FIG. 2B shows the how the disk units are paired so far, and shows that space list 93 contains disk units 65 and 66.

Block 103 of FIG. 3 asks whether there are any disk units on the spare list. Disk units are placed on a spare list if they could not be paired because the potential pairing did not exceed the specified threshold level of protection, or if the upper portion of the segment contains a different number of disk units than the lower portion of the segment. Since spare list 93 contains disk units 65 and 66, block 103 is answered affirmatively and block 400 calls the Pair Spares Subroutine of FIG. 6.

Block 401 loops through the spare list and selects a potential pair of disk units. In our example, since disk units 65 and 66 are the only disk units on the spare list at present, they are selected as a potential pair. The Calculate Level of Protection Subroutine of FIG. 5 is again called in block 300. This subroutine determines that disk units 65 and 66 are in the same enclosure in block 311. The subroutine returns to block 402 of FIG. 6. Block 402 determines that mating disk units 65 and 66 would not be valid, since their level of protection does not exceed the threshold level of protection. Therefore, disk units 65 and 66 are still unpaired, and block 403 is answered affirmatively.

The Pair Spares Subroutine then executes blocks 411, 300, 412, and 413. This group of blocks attempts to find a different potential mate for disk unit 65 on spare list 92 by proceeding through the spare list in a different order, starting the indicies for both potential mates at the bottom instead of the top. Since the only potential mate for disk unit 65 is disk unit 66, previously determined to be an invalid mate, this group of blocks is unsuccessful at finding a valid mate. Blocks 421, 300, 422, and 423 are executed to also try to find a different mate. This group of blocks is also unsuccessful, and block 423 is answered affirmatively. Note that blocks 402, 412 and 422 each perform a function very similar to blocks 220, 221, 211, 210, 212, and 213 of FIG. 4.

Block 440 unpairs the existing pair with the least level of protection and adds them to spare list 93. In our example, disk units 73 and 74 have the lowest level of protection: controller level of protection. Therefore, this pair is broken up and disk units 73 and 74 are added to spare list 93. Flow of control moves back to block 401, where attempts are made to pair up the disk units now on the spare list: disk units 65, 66, 73, and 74. This time, things work much better, and disk unit 65 is paired with disk unit 73, and disk unit 66 is paired with disk unit 74 in blocks 401, 300, 402, and 403. These pairings have bus level of protection, so block 403 is answered negatively, and the subroutine returns in block 450 to block 500 of FIG. 3. The pairing of the disk units is shown in FIG. 2C.

The Optimize Subroutine of FIG. 7 is called in block 500. Since all paired disk units have bus level of protection, no swapping of mates occurs, and the subroutine returns to block 110 of FIG. 3.

Referring again to FIG. 3, a screen is displayed to the user stating the pairing selected for each disk unit of the computer system in block 110. An example of such a screen for computer system 11 of FIG. 2 is shown in FIG. 9B. This screen identifies the level of protection for each disk unit in computer system 11, and asks the user whether this is acceptable or not. If the user accepts the pairing, the disk units are mirrored in block 112, and the program ends in block 120.

Configuration Change Detection

Another aspect of this invention is the ability to detect a configuration change and calculate the level of protection both before and after the configuration change. If the configuration change (adding, deleting, replacing, or relocating hardware) results in a reduced level of protection, the user is warned of this fact so that corrective action, such as breaking up and re-pairing the existing pairs of disk units, can be taken.

Let us assume that computer system 12 of FIG. 2D has had all of its disk units paired using the techniques discussed above, and the following pairs have been made: disk units 61+69, 62+70, 63+67, 64+65, and 66+68. All pairs except 64+65 have bus level protection. Pair 64+65 has I/O processor level of protection.

The user changes the configuration of computer system 12 by adding disk units 73 and 74, along with controllers 57 and 58 and I/O processor 35, so that computer system 12 now looks like computer system 11 of FIG. 2A.

Referring again to FIG. 3, if block 101 determines that the user does not desire to initiate pairing at this time, block 102 determines if there has been a configuration change in the computer system. In the preferred embodiment, the computer system determines this by keeping a record of the last known I/O address of a device, and compares it with the current I/O address of the device as part of each Initial Program Load (IPL). The computer system also knows when new components are added, since the user must perform a reconfiguration in order for these new components to be recognized by the computer system. Here, block 102 detects a changed configuration due to the addition of disk units 73 and 74, so block 600 calls the Changed Configuration Subroutine of FIG. 8.

Figure 8:
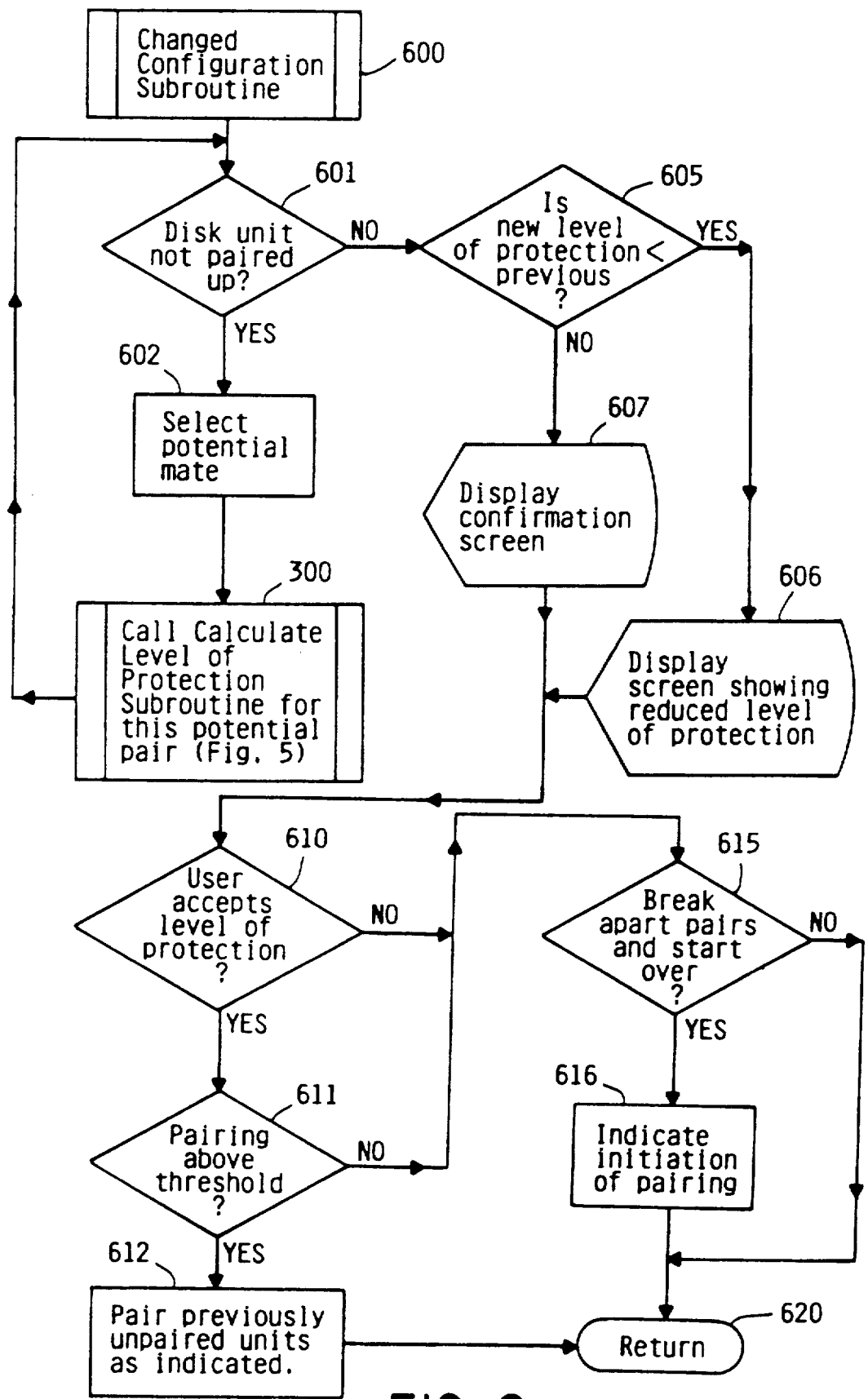

Referring now to FIG. 8, block 601 asks if a disk unit is not paired up. In our example, newly added disk units 73 and 74 have not been paired up yet, so block 601 is answered affirmatively. Block 602 selects a potential mate for disk unit 73—in this case, the only possible unpaired mate is disk unit 74. Block 300 calls the Calculate Level of Protection Subroutine of FIG. 5, which determines that potential pair 73 and 74 have a controller level of protection in blocks 305-306 and returns to block 601 of FIG. 8. Block 601 determines that there are no more disks units to pair up, so flow of control moves to block 605. Block 605 asks if the new level of protection of the computer system is less than the previous level of protection. The previous level of protection was, via a least common denominator approach taken in the preferred embodiment, I/O processor level of protection, since one disk unit pair had I/O processor level of protection. The new level of protection, by the same approach, is controller level of protection. Therefore, the level of protection of computer system 12 was reduced by the configuration change, so block 605 is answered affirmatively. Alternatively, the computer system can also keep track of the level of protection for each disk unit and inform the user if any unit's protection is reduced. Block 606 displays a screen to the user showing the reduced level of protection of computer system 12. An example of such a screen is shown in FIG. 9C.

The user is then given the option to accept the lower level of protection and pair the new units together as indicated. If the user accepts the level of protection, block 611 determines whether the pairing is above the threshold level of protection. If so, block 612 pairs the previously unpaired disk units together and returns in block 620 to block 115 of FIG. 3. In our example, assume that the user did not accept the reduced level of protection of computer system 12, so block 610 is answered negatively. Block 615 determines if the user wants to break apart the existing pairs and re-pair the disk units of computer system. If not, the subroutine returns in block 620 to block 115 of FIG. 3. In our example, the user does want to break apart the existing pairs and re-pair the disk units of computer system 12, so block 615 is answered affirmatively. Block 616 indicates that pairing should be initiated, and returns in block 620 to block 115 of FIG. 3.

Referring again to FIG. 3, block 115 asks if pairing should be initiated. If not, the program ends in block 120. Since block 616 of FIG. 8 indicated that pairing should be initiated, block 115 is answered positively and flow of control moves back to block 200, where the disk units of the computer system 12, including added disk units 73 and 74, are re-paired in the same manner as has been discussed with respect to computer system 11.

While this invention has been described with respect to the preferred and various alternate embodiments, it will be understood by those skilled in the art that various changes in detail may be made therein without departing from the spirit, scope and teaching of the invention. For example, this invention would work to pair storage devices other than disk units. In addition, these storage devices could be paired up for reasons other than mirroring. Accordingly, the herein disclosed is to be limited only as specified in the following claims.

What is claimed is:

1. A method of protecting a computer system against inaccessible data, said computer system having a plurality of paired disk units, said method comprising the machine-executed steps of:

detecting upon initialization of said computer system that a disk unit has been added to, or deleted, replaced or relocated from said plurality of disk units, thereby resulting in a configuration change in said computer system;

determining whether said configuration change results in a reduced level of protection against inaccessible data; and informing a user of said reduced level of protection.

2. The method of claim 1, further comprising the step of:

re-pairing the disk units to maximize the level of protection against inaccessible data.

3. The method of claim 1, further comprising the step of:

giving said user the option to accept said reduced level of protection.

4. A computer system having protection against inaccessible data, said computer system comprising:

a first bus;

a second bus;

a first disk unit connected to said first bus;

a second disk unit connected to said second bus;

calculating means for calculating a level of protection against inaccessible data if said first disk unit were paired with said second disk unit; and pairing means, responsive to said calculating means, for pairing said first disk unit with said second disk unit.

5. The computer system of claim 4, wherein said calculating means further comprises:

means for detecting that said first disk unit and said second disk unit are connected to different busses; and means for setting a bus level of protection for the pairing of said first disk unit and said second disk unit.

6. The computer system of claim 5, further comprising:

determining means for determining that said level of protection calculated by said calculating means provides a maximum level of protection.

7. A computer system having protection against inaccessible data, said computer system comprising:

a first bus;

a second bus;

a first I/O processor connected to said first bus;

a second I/O processor connected to said first bus;

a third I/O processor connected to said second bus;

a plurality of disk units, further comprising:

first and second disk units connected to said first I/O processor;

third and fourth disk units connected to said second I/O processor;

fifth and sixth disk units connected to said third I/O processor;

calculating means for repeatedly calculating levels of protection against inaccessible data is selected one of said plurality of disk units were paired together; and pairing means, responsive to said calculating means, for pairing said first disk unit with said fifth disk unit, said second disk unit with said third disk unit, and said fourth disk unit with said sixth disk unit, thereby achieving a maximum level of protection against inaccessible data.

* * * * *